United States Patent [19]

Finger et al.

[11] 4,012,681

[45] Mar. 15, 1977

[54] BATTERY CONTROL SYSTEM FOR BATTERY OPERATED VEHICLES

[75] Inventors: Eugene P. Finger, Brewster; Edward M. Marwell, Mount Kisco, both of N.Y.

[73] Assignee: Curtis Instruments, Inc., Mount Kisco, N.Y.

[22] Filed: Jan. 3, 1975

[21] Appl. No.: 538,466

[52] U.S. Cl. .................................. 320/14; 320/44; 320/48; 324/29.5; 340/249

[51] Int. Cl.² .......................................... H02J 7/00

[58] Field of Search ................ 320/13, 14, 39, 40, 320/43–45, 48, DIG. 2; 324/29.5, 94; 340/249

[56] References Cited

UNITED STATES PATENTS

| | | | |
|---|---|---|---|
| 3,045,178 | 7/1962 | Corrsin | 324/68 |
| 3,193,763 | 7/1965 | Beusman | 324/94 |
| 3,255,413 | 6/1966 | Marwell et al. | 324/94 |
| 3,343,083 | 9/1967 | Beusman | 324/94 |
| 3,389,325 | 6/1968 | Gilbert | 320/DIG. 2 |
| 3,417,307 | 12/1968 | Kosa et al. | 320/14 X |
| 3,421,067 | 1/1969 | Wilson et al. | 320/14 |
| 3,617,850 | 11/1971 | Domshy | 320/44 X |
| 3,704,431 | 11/1972 | Finger | 324/94 X |
| 3,704,432 | 7/1971 | Finger | 324/94 X |

OTHER PUBLICATIONS

Moreton, P. L., "Fuel Gauge for the Electric Car," Proc. IEE, vol. 119, No. 6 (6/72) pp. 649–654.

*Primary Examiner*—Robert J. Hickey
*Attorney, Agent, or Firm*—Pennie & Edmonds

[57] ABSTRACT

A system is disclosed for monitoring the state of charge of batteries in a fleet of electrically powered vehicles. Each battery has associated with it an integrator module which registers both the depletion and charging of the battery. While the battery is in use in the vehicle, a portion of the current flowing from the battery is sent to the integrator module which registers the current depletion. A readout circuit is also coupled to the integrating device for indicating the condition of the battery while it is in the vehicle. When the battery reaches a predetermined low state of charge, circuitry provided for detecting this condition provides a prewarning signal and on further discharge disables nonessential auxiliary functions in the vehicle, leaving only those systems working which are necessary in order for the driver to be able to return to a battery charging station. At the charging station, the integrator module and the battery are removed from the vehicle and connected at the charging station. During charging, the integrator module is coupled to the charger and a portion of the current leaving the charger passes through the integrator module providing continuous display of the state of charge and information to regulate the charge rate and terminate charge when appropriate ampere hours have been returned to the battery.

7 Claims, 2 Drawing Figures

BATTERY CONTROL SYSTEM FOR BATTERY OPERATED VEHICLES

BACKGROUND OF THE INVENTION

This invention concerns a system useful with instruments that are capable of measuring and indicating the total electric current that has been conducted through an electrical circuit. It is particularly useful with electrochemical devices known as coulometers and therefore will be described in conjunction with such devices.

Coulometers are described in detail in Lester Corrsin's U.S. Pat. No. Re. 27,556 entitled "Operating Time Indicator" and Curtis Beusman's U.S. Pat. No. 3,193,763 entitled "Electrolytic Coulometric Current Integrating Device," both of which are incorporated herein by reference.

The device described in these patents includes a tubular body of nonconductive material having a bore therethrough that supports two columns of a liquid metal such as mercury. The adjacent innermost ends of these columns are separated by a small volume of electrolyte with which they make conductive contact. The outermost ends of the liquid metal columns contact conductive leads that connect the instrument to the source of electric current that is to be measured. In accordance with Faraday's Law, when current flows through the instrument, liquid metal is electroplated from the anode column to the cathode column, causing the anode to decrease in length and the cathode to increase an equal amount, the change in column length being directly proportional to the total electric charge passed through the instrument.

Readout of the total current through the instrument may be made by comparing the length of a column against a calibrated scale. Typical visual readout devices are described in the above-identified Corrsin patent and in Beusman's U.S. Pat. No. 3,343,083 entitled "Nonself-Destructive Reversible Electrochemical Coulometer." It has also been found that the coulometer may be read out electrically by measuring changes in the capacitance between the mercury columns and an electrode surrounding the tubular body. The details of such a readout device are set forth in Edward Marwell and Curtis Beusman's U.S. Pat. No. 3,255,413 entitled "Electro-Chemical Coulometer Including Differential Capacitor Measuring Elements" and Eugene Finger's U.S. Pat. Nos. 3,704,431 and 3,704,432 entitled "Coulometer Controlled Variable Frequency Generator" and "Capacitive Coulometer Improvements," respectively, all of which are incorporated herein by reference.

SUMMARY OF THE INVENTION

The present invention is directed to a system for maintaining control over the state of charge of a battery in a single or more commonly a plurality of battery powered vehicles, each of which may include various battery powered tools, such as fork lifts or the like. Each vehicle may also be provided with circuitry for displaying the state of charge of the battery. The display of this information may be made by a conventional electric meter and can be calibrated in terms of percentage charge remaining in the battery. The display would be similar to a display showing the fuel remaining in a conventional gasoline powered vehicle and would, therefore, be quite easy for an operator familiar only with gasoline powered vehicles to read and understand. The system is also provided with a low charge detector which, when the remaining charge in the battery has been depleted below a predetermined level, disables the various tools on the vehicle, leaving only those systems that are essential for the operator to be able to return to a battery charging station.

In the preferred embodiment of the invention, the state of charge of the battery is monitored by a coulometer in a module which is connected to the vehicle during operation. A small amount of the current flowing from the battery passes via a calibrated shunt to the coulometer. The coulometer thus records the extent to which the battery charge has been depleted. This is sensed by a detection circuit inside the module. The detection circuit drives the electric meter in the vehicle that serves as the state of charge display (i.e., the fuel indicator). The output of the detection circuit is also coupled to the low charge detector which disables nonessential electrical circuits. The module is also provided with a deep discharge rejection circuit which prevents the coulometer from being overdriven. When battery discharge is unusually deep, this circuit passes a current through the coulometer equal in magnitude and opposite in direction to that coming from the shunt, thereby resulting in a net current of zero through the coulometer, zero voltage across the coulometer, and the prevention of further integration.

At the charging station, the battery and its associated module containing the coulometer may be removed from the vehicle and plugged into charging equipment. This equipment comprises a battery charger and a meter for displaying the state of charge of the battery as recorded and detected by the coulometer module. While the battery is being recharged, a small amount of the charging current is diverted from the calibrated shunt to the coulometer. Thus, the coulometer in the module is reset along with the battery, thereby insuring that the module reflects the state of charge of the battery associated with it. The fully charged battery, along with its associated module, is then returned to the vehicle. The battery charging station is also provided with circuitry which monitors the state of the coulometer and disconnects the charger when the battery has been fully charged. If for some reason the charger is not disconnected, an overcharge rejection circuit in the module prevents the coulometer from being overdriven. This circuit causes an electric current equal in magnitude and opposite in direction to that produced by the shunt to flow through the coulometer, resulting in a net current of zero through the coulometer, thereby preventing the advancement and damage of the coulometer.

DETAILED DESCRIPTION OF THE PREFERRED EMBODIMENT

Figure 1:
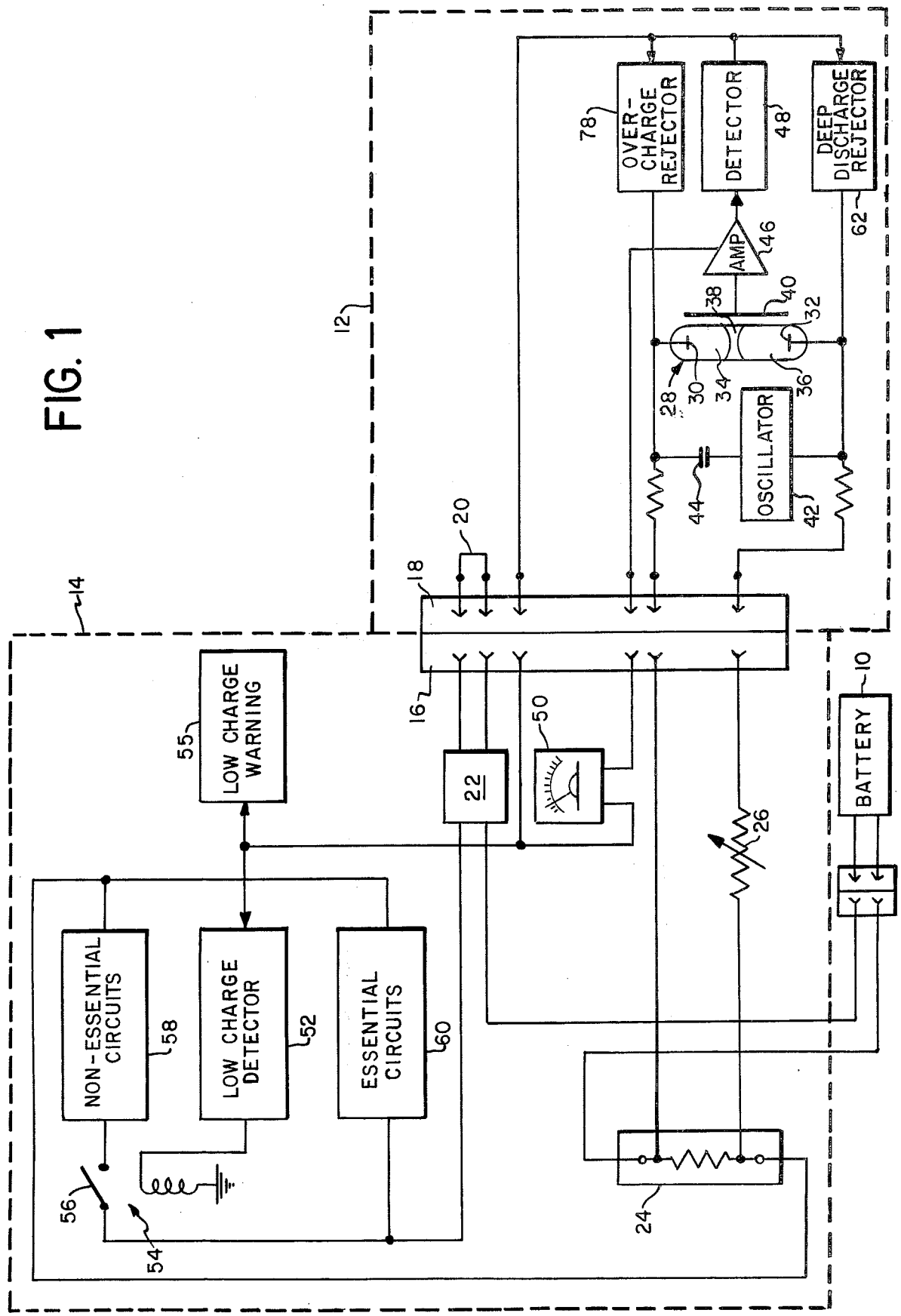
FIG. 1 is a schematic illustration in block diagram form of an illustrative electrical power system of a vehicle provided with a battery state of charge monitoring system constructed in accordance with the present invention.

Referring to FIG. 1, the vehicle is supplied with power by an electrical storage battery 10 which is connected to the electrical power system of the vehicle by a suitable connector. Associated with battery 10 is a coulometer module 12. Module 12 is shown connected to vehicle control system 14 by connector 16 in vehicle control system 14 and connector 18 in the module. The module includes a loop 20 which, when module 12 is plugged into the system, acts to complete the electrical circuit through control circuit 22, thereby serving as an interlock. Circuit 22 acts as a switch in series with the battery. Current flowing through the electrical system flows through a shunt resistor 24, which can be any resistor of relatively low value or a calibrated length of wire in the system. As current flows through the system, a small amount of the current passing through the system is sent via a variable resistor 26 to a coulometer 28 in the module.

The coulometer comprises a pair of electrodes 30 and 32 at opposite ends of a capillary tube. Columns of mercury 34 and 36 are in contact with electrodes 30 and 32 respectively. The space in between the columns of mercury is filled with an electrolyte 38. As current passes through the module during use of the battery, mercury is transferred unidirectionally from the column at the anode of the coulometer to that at the cathode. Thus, the length of columns 34 and 36 adjacent the two electrodes 30 and 32 is an indication of the amount of charge remaining in the battery. In particular, as the charge in battery 10 is depleted, the length of the mercury column in contact with electrode 30 will be proportional to the charge remaining in the battery. The rate at which the coulometer is advanced may be varied for batteries of different capacity by proper adjustment of resistor 26.

As explained in the above-referenced U.S. Pat. Nos. 3,255,413, 3,704,431 and 3,704,432, the coulometer may be read out electrically by measuring changes in the capacitance between an electrode surrounding the capillary tube of the coulometer and the mercury columns as the columns change in length. An electrode 40 is provided by a thin metal film surrounding the coulometer tube. Readout is provided by an oscillator 42 that produces a high frequency signal which is coupled to electrode 30 by capacitor 44. The capacitance between mercury column 34 and electrode 40 is proportional to the length of column 34. Thus, the efficiency with which the AC signal is coupled to electrode 40 and the magnitude of that signal at the electrode is also proportional to the length of column 34. The signal present at electrode 40 is coupled to an amplifier 46 which amplifies it and sends it to a detector 48 which demodulates the signal and provides a DC level proportional to the magnitude of the AC signal present on electrode 40. Detector 48 drives a display device 50 in vehicle control system 14, which may be a simple d'Arsonval meter. Display device 50 serves the function of a conventional fuel meter in a gasoline operated vehicle by indicating the state of charge of battery 10.

The output of detector 48 is sent to a detector 52, which is a threshold device set to actuate lock-out relay 54 when detector 48 indicates that only a minimum amount of charge remains in the battery. The advent of this condition is first signaled by low charge warning circuit 55. Actuation of relay 54 opens its contacts 56, thereby removing power from auxiliary function circuits 58, such as automatic lift equipment or any other non-essential subsystems of the vehicle. However, even after this occurs, current still flows to any essential circuits 60, such as a traction motor in the vehicle, permitting the operator to return to the battery charging station to receive a new battery.

The circuitry in the module may also be provided with a deep discharge rejector 62. Rejector circuit 62 prevents electric current from resistor 26 from overdriving coulometer 28 into the nonreversible region of operation. At a threshold value before the beginning of the nonreversible region, rejector 62 is activated and passes through the coulometer a current at least as great as and opposite in direction to the current passing through variable resistor 26, thus canceling out the effect of the current passing through resistor 26, and causing the integral in the coulometer to hunt around the threshold value.

Figure 2:
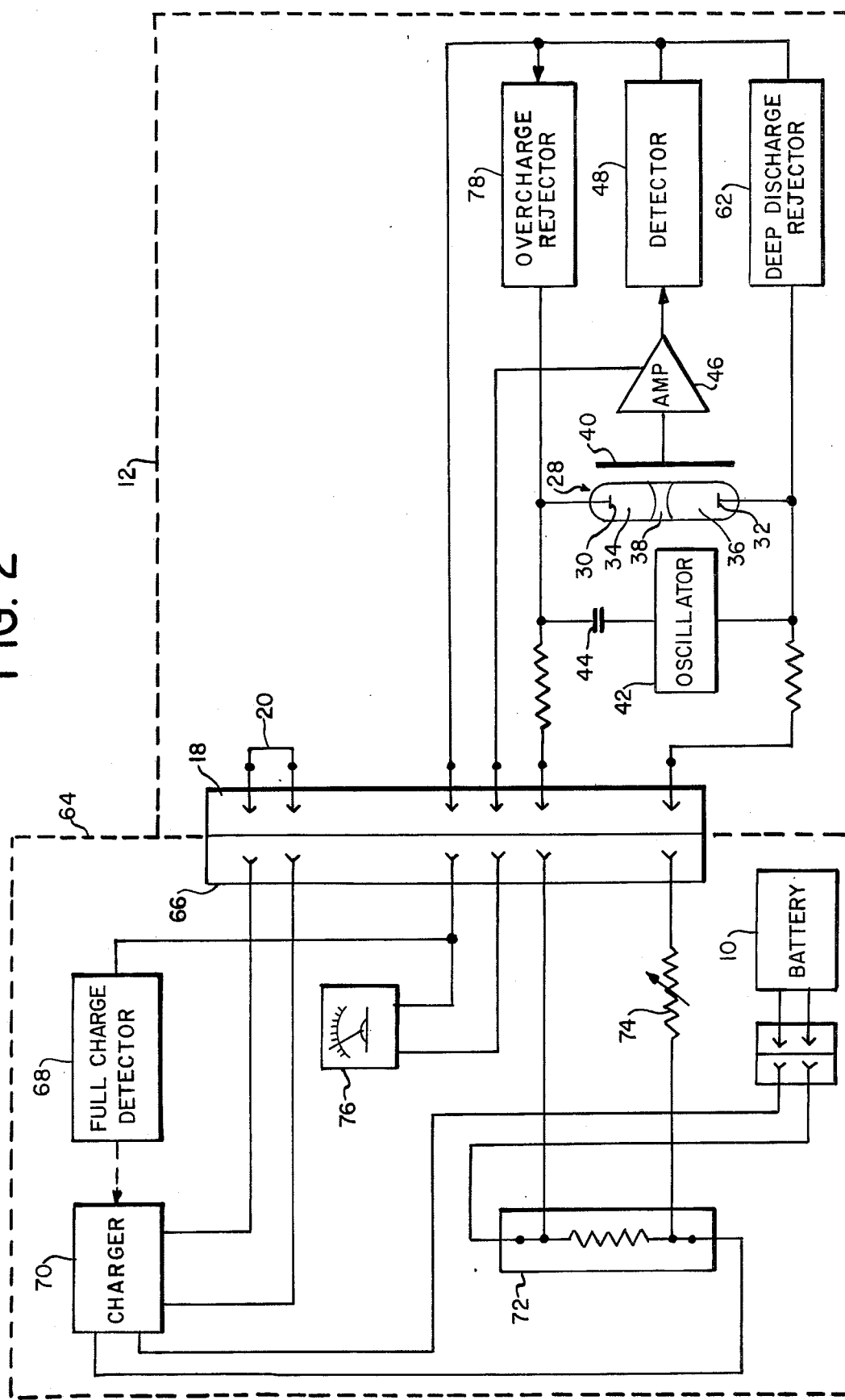
FIG. 2 is a schematic representation of an illustrative electrical power system of a charging station constructed in accordance with the present invention.

In accordance with the present invention, the amount of charge still remaining in each of the batteries in each of the vehicles in the system would be periodically checked, for example, at the end of each work shift. When it is desired to charge the battery, the battery and its associated module would be connected to a charging station 64 as is schematically illustrated in block diagram form in FIG. 2. This is accomplished by removing the coulometer module 12 from the vehicle and connecting it to the electrical circuit of the charging station via connectors 18 and 66. A new battery along with the coulometer module associated with that new battery would then be placed in the vehicle, while the discharged battery would be connected to and charged at the charging station.

When a depleted battery is connected to the charging station, full charge detector 68, whose input is coupled to the output of detector 48, senses that the battery is not fully charged and activates a battery charger 70, thereby charging battery 10. The charging circuit is activated by interlock loop 20 in the module and calibrated shunt 72. A variable resistor 74, which is coupled to shunt 72, samples a small amount of the current and passes it to the module and through the coulometer, thus reversing the action caused by the discharge of the battery on the distribution of mercury between the columns of mercury 34 and 36 in contact with electrodes 30 and 32 in coulometer 28. This is achieved because the flow of current through battery 10 during the charging operation is opposite that during discharge and hence the transfer of mercury through coulometer 28 is opposite the direction of transfer during discharge. Resistor 74 is adjusted to a value which causes it to accurately track the level of charge of the battery. The state of charge of the battery during the charging operation is displayed by meter 76. When the battery is fully charged, the DC output level of detector 48 that is representative of full charge is sensed by full charge detector 68, resulting in deactivation of charger 70.

If for some reason the charger is not deactivated, an overcharge rejector 78 coupled to the output of detector 48 senses that the DC level has gone beyond that representative of full charge. Rejector 78 prevents the overdriving of coulometer 28 into a nonreversible region of operation by passing a current equal in magnitude and opposite in direction to that current provided by resistor 74 to coulometer 28.

It is also contemplated alternatively that battery 10 may be made to physically accommodate coulometer module 12, thus insuring that the coulometer will always be associated with the proper battery. Also, if desired, information from the coulometer module may be read, recorded and processed using conventional data processing equipment. In this manner, the system could thereby be adapted to automatically indicate various operating conditions that a user would like to have available. Of course, it is also understood that while a particular embodiment of the invention has been disclosed, various changes and substitutions could be made by those skilled in the art.

For example, it may be desired to add additional threshold circuits similar to full charge detector 68 to perform various functions in the system. Such a circuit or circuits would be coupled to the output of detector 48 and would be responsive to various levels in the output of detector 48 to perform various functions such as turning on a display device to alert an operator that the battery is nearly fully charged. It may also be desired to use such a threshold device or plurality of threshold devices to control the rate at which charger 70 charges the battery. This particular feature may be especially advantageous in systems where the ability of a battery to accept charge varies widely dependent upon the state of charge of the battery.

It is also noted that some batteries, due to their inherent inefficiencies, require a quantity of coulombs to fully charge them which is greater than the coulombs which they will deliver in use. For this reason, in many systems it would be necessary for the relationship between current flowing through the battery and current flowing through the coulometer to be different dependent upon whether the system is being charged or discharged. This may be most easily compensated for in the preferred embodiment by setting resistors 26 and 74 at different values. Such obvious modifications are within the purview of the appended claims.

What is claimed is:

1. Apparatus for monitoring the state of charge of a battery during both its charge at a charging station and its discharge during use in a vehicle, said apparatus comprising:
   a. a module which is connectable to either said vehicle or said charging station;
   b. an integrating device contained in said module;
   c. means responsive to said integrating device for producing a signal which is proportional to the integral stored by said integrating device and is therefore a measure of the state of charge of said battery;
   d. means for mounting the module on said vehicle and for supplying to said integrating device a first current which is a portion of the current flowing from said battery and is therefore a measure of its decrease in charge; and
   e. means for mounting the module at said charging station and for supplying to the integrating device a resetting current which is a portion of the current flow to said battery.

2. Apparatus as in claim 1 wherein said integrating device and said signal producing means are in said module.

3. Apparatus as in claim 1, further comprising:
   a. means for coupling power to the essential subsystems in the vehicle;
   b. switch means responsive to said signal producing means for detecting when the state of charge of the battery reaches a first predetermined level; and
   c. means responsive to said switch means for decoupling power from at least one nonessential subsystem in said vehicle when the state of charge of the battery has reached said first predetermined level.

4. Apparatus as in claim 1, further comprising:
   a. an electrical charger at the charging station for supplying a charging current to the battery; and
   b. means responsive to said signal producing means for detecting when the state of charge of the battery has been recharged to a second predetermined level and deactivating said charger.

5. The apparatus of claim 1 further comprising display means responsive to said signal producing means for indicating the state of charge of said battery.

6. An apparatus as in claim 1, wherein said integrating device is a coulometer which includes two electrodes and a plate, and said signal producing means comprises:
   a. an oscillator for applying an AC signal to said integrating device;
   b. conductor means capacitively coupled to said integrating device for receiving said AC signals; and
   c. demodulator means for converting said received AC signals to a DC signal which is proportional to the amplitude of said AC signals.

7. A control system for a device powered by a battery comprising:
   a. an integrating device;
   b. means for supplying to the integrating device a first current which is a portion of the current flowing from said battery and therefore a measure of its decrease in charge;
   c. means responsive to said integrating device for producing a signal which is proportional to the integral stored in said integrating device and is therefore a measure of the state of charge of the battery;
   d. means for detecting when the integral stored reaches a first predetermined level and for decoupling at least one nonessential subsystem in said device when the integral stored reaches said first predetermined level; and
   e. rejector means responsive to said signal producing means for detecting when the integral stored reaches a second predetermined level which is beyond said first predetermined level and for reducing the net current flow through the integrator substantially to zero.

* * * * *